US012772639B2

(12) United States Patent
Park et al.

(10) Patent No.: US 12,772,639 B2
(45) Date of Patent: Oct. 20, 2026

(54) DISPLAY DEVICE AND METHOD OF MANUFACTURING THE SAME

(71) Applicant: Samsung Display Co., LTD., Yongin-si (KR)

(72) Inventors: Joon Yong Park, Yongin-si (KR); Hyun Eok Shin, Yongin-si (KR); Sung Joo Kwon, Yongin-si (KR); Sam Tae Jeong, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 470 days.

(21) Appl. No.: 18/473,534

(22) Filed: Sep. 25, 2023

(65) Prior Publication Data

US 2024/0105899 A1 Mar. 28, 2024

(30) Foreign Application Priority Data

Sep. 26, 2022 (KR) ........................ 10-2022-0121837

(51) Int. Cl.

| | |
|---|---|
| ***H01L 33/62*** | (2010.01) |
| ***H01L 25/16*** | (2023.01) |
| ***H10H 20/857*** | (2025.01) |
| ***H10W 90/00*** | (2026.01) |
| *H10H 20/01* | (2025.01) |

(52) U.S. Cl.

CPC .......... *H10H 20/857* (2025.01); *H10W 90/00* (2026.01); *H10H 20/0364* (2025.01)

(58) Field of Classification Search

CPC .............................. H01L 33/62; H01L 25/167

See application file for complete search history.

(56) References Cited

U.S. PATENT DOCUMENTS

| | | | |
|---|---|---|---|
| 7,880,176 B2 | 2/2011 | Seong et al. | |
| 8,441,185 B2 | 5/2013 | Kuwabara et al. | |
| 9,831,451 B2 | 11/2017 | Lee | |
| 11,844,244 B2 | 12/2023 | Ko et al. | |
| 2003/0134149 A1 | 7/2003 | Miyashita et al. | |
| 2021/0367183 A1 | 11/2021 | Lim et al. | |
| 2022/0051370 A1* | 2/2022 | Xie | G06T 5/75 |

FOREIGN PATENT DOCUMENTS

| | | |
|---|---|---|
| JP | 2011-233545 A | 11/2011 |
| KR | 10-2006-0007958 A | 1/2006 |
| KR | 10-1216652 | 12/2012 |
| KR | 10-2020-0020327 | 2/2020 |
| KR | 10-2021-0145049 | 12/2021 |
| KR | 10-2333759 | 12/2021 |
| KR | 10-2022-0060074 A | 5/2022 |

* cited by examiner

*Primary Examiner* — Joseph L Williams

(74) *Attorney, Agent, or Firm* — Harness, Dickey & Pierce, P.L.C.

(57) ABSTRACT

A method of manufacturing a display device includes aligning light emitting elements in an emission area on a substrate, depositing an indium-tin alloy on an entire surface of the substrate at room temperature, heat-treating the indium-tin alloy to reflow along side surfaces of each of the light emitting elements, heat-treating the indium-tin alloy in an oxygen atmosphere to form indium tin oxide, and etching the indium tin oxide to form a first pixel electrode contacting first ends of at least a portion of the light emitting elements.

13 Claims, 17 Drawing Sheets

DISPLAY DEVICE AND METHOD OF MANUFACTURING THE SAME

CROSS-REFERENCE TO RELATED APPLICATION(S)

This application claims priority to and benefits of Korean Patent Application No. 10-2022-0121837, filed Sep. 26, 2022 in the Korean Intellectual Property Office, the entire contents of which are incorporated herein by reference.

BACKGROUND

1. Technical Field

This disclosure relates to a display device and a method of manufacturing the same.

2. Description of Related Art

In recent years, as interest in information display is increasing, research and development of display devices is continuously conducted.

SUMMARY

This disclosure provides a method of manufacturing a display device in which an indium-tin alloy deposited on light emitting elements may be heat-treated in a vacuum atmosphere and heat-treated in an oxygen atmosphere to form a pixel electrode.

This disclosure provides a display device formed by the above-described manufacturing method.

However, embodiments of the disclosure are not limited to those set forth herein, and may be variously extended without departing from the scope of the disclosure.

A method of manufacturing a display device according to embodiments of the disclosure may include aligning light emitting elements in an emission area on a substrate, depositing an indium-tin alloy on an entire surface of the substrate at room temperature, heat-treating the indium-tin alloy to reflow along side surfaces of each of the light emitting elements, heat-treating the indium-tin alloy in an oxygen atmosphere to form indium tin oxide, and etching the indium tin oxide to form a first pixel electrode contacting first ends of at least a portion of the light emitting elements.

According to an embodiment, in the heat-treating of the indium-tin alloy to reflow, the indium-tin alloy may be heat-treated for about 0.5 hour to about 1 hour in a vacuum atmosphere at a temperature of about 200° C. to about 230° C.

According to an embodiment, in the heat-treating of the indium-tin alloy in the oxygen atmosphere to form the indium tin oxide, the indium-tin alloy may be heat-treated in the oxygen atmosphere of about 250° C. or less.

According to an embodiment, a thickness of the first pixel electrode may be about 150 Å to about 500 Å.

According to an embodiment, the indium tin oxide may include indium oxide and tin oxide, and a composition ratio of the indium oxide and the tin oxide may be determined by adjusting a composition ratio of indium and tin in the indium-tin alloy.

According to an embodiment, the indium tin oxide may have a mass percentage of about 85 wt % to about 95 wt % of the indium oxide and about 5 wt % to about 15 wt % of the tin oxide.

According to an embodiment, a resistivity of the indium tin oxide may be about 270 μΩ-cm to about 350 μΩ-cm.

According to an embodiment, the light emitting elements may have a diameter and a length of nanoscale.

According to an embodiment, the method of manufacturing the display device may further include patterning an insulating layer on the first pixel electrode, depositing an indium-tin alloy on an entire surface of the insulating layer at room temperature, heat-treating the indium-tin alloy to reflow along exposed side surfaces of each of the light emitting elements, heat-treating the indium-tin alloy in an oxygen atmosphere to form indium tin oxide, and etching the indium tin oxide to form a second pixel electrode contacting second ends opposite the first ends of at least a portion of the light emitting elements.

According to an embodiment, a thickness of the second pixel electrode may be about 150 Å to about 500 Å.

According to an embodiment, a resistivity of the indium tin oxide may be about 270 μΩ-cm to about 350 μΩ-cm.

According to an embodiment, the method of manufacturing the display device may further include forming a color conversion layer including color conversion particles or light scattering particles and filling the emission area on the first pixel electrode, and forming a capping layer including an inorganic insulating material and a low refractive index layer having a lower refractive index than that of the color conversion layer on the color conversion layer.

According to an embodiment, the light emitting elements may be aligned in a direction between bank patterns formed adjacent to each other in the emission area.

A display device according to embodiments of the disclosure may include a pixel circuit layer including a transistor, and a display element layer disposed on the pixel circuit layer. The display element layer may include bank patterns spaced apart from each other in an emission area, light emitting elements disposed between the bank patterns, a first pixel electrode in contact with first ends of at least a portion of the light emitting elements and electrically connected to the pixel circuit layer, and a second pixel electrode in contact with second ends of at least a portion of the light emitting elements and electrically connected to the pixel circuit layer. A thickness of the first pixel electrode and the second pixel electrode may be about 150 Å to about 500 Å.

According to an embodiment, the first pixel electrode and the second pixel electrode may include indium tin oxide composed of indium oxide and tin oxide.

According to an embodiment, the indium tin oxide may have a mass percentage of about 85 wt % to about 95 wt % of the indium oxide and about 5 wt % to about 15 wt % of the tin oxide.

According to an embodiment, a resistivity of the first pixel electrode and the second pixel electrode may be about 270 μΩ-cm to about 350 μΩ-cm.

According to an embodiment, the display device may further include a color conversion layer including color conversion particles or light scattering particles, the color conversion layer being disposed on the first pixel electrode and the second pixel electrode to fill the emission area, and a low refractive index layer disposed on the color conversion layer and having a lower refractive index than that of the color conversion layer.

According to an embodiment, the light emitting elements may have a diameter and a length of nanoscale.

BRIEF DESCRIPTION OF THE DRAWINGS

The accompanying drawings, which are included to provide a further understanding of the disclosure, and are incorporated in and constitute a part of this specification, illustrate embodiments, and, together with the description, serve to explain principles of the disclosure.

DETAILED DESCRIPTION OF THE EMBODIMENTS

Figure 1:
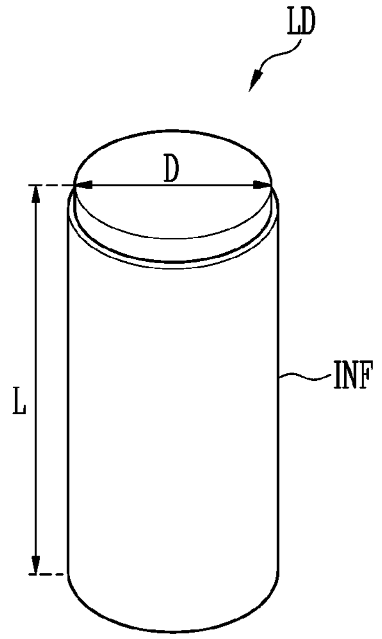
FIG. 1 is a perspective view schematically illustrating a light emitting element according to embodiments of the disclosure.

Hereinafter, embodiments of the disclosure will be described in more detail with reference to the accompanying drawings. The same reference numerals are used for the same elements in the drawings, and duplicate descriptions for the same elements are omitted.

The embodiments described in the specification are intended to clearly explain the scope of the disclosure to those of ordinary skill in the art to which the disclosure pertains. Therefore, the disclosure is not limited by the embodiments described in the specification, and the scope of the disclosure should be construed to include modifications or variations without departing from the scope of the disclosure.

The accompanying drawings in the specification are for explaining the disclosure. Since the shapes shown in the drawings may be exaggerated as necessary to help the understanding of the disclosure, the disclosure is not limited by the drawings.

In the specification, when it is determined that a detailed description of a configuration or function related to the disclosure may obscure the gist of the disclosure, a detailed description thereof will be omitted if necessary.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
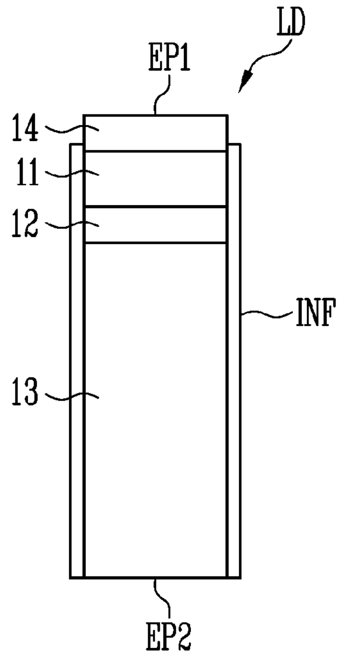
FIG. 2 is a schematic cross-sectional view illustrating an example of the light emitting element of FIG. 1.

FIG. 1 is a perspective view schematically illustrating a light emitting element LD according to embodiments of the disclosure. FIG. 2 is a schematic cross-sectional view illustrating an example of the light emitting element LD of FIG. 1.

Referring to FIGS. 1 and 2, the light emitting element LD may include a first semiconductor layer 11, an active layer 12, and a second semiconductor layer 13. In an embodiment, the light emitting element LD may further include an electrode layer 14.

The light emitting element LD may have various shapes. For example, the light emitting element LD may have a columnar shape extending along a direction. The light emitting element LD may have a first end EP1 and a second end EP2. One of the first and second semiconductor layers 11 and 13 may be adjacent to the first end EP1 of the light emitting element LD. The other one of the first and second semiconductor layers 11 and 13 may be adjacent to the second end EP2 of the light emitting element LD. For example, the first semiconductor layer 11 may be adjacent to the first end EP1 of the light emitting element LD, and the second semiconductor layer 13 may be adjacent to the second end EP2 of the light emitting element LD.

According to an embodiment, the light emitting element LD may be a light emitting element manufactured in a columnar shape through an etching method or the like. In the specification, the columnar shape may include a rod-like shape or a bar-like shape having an aspect ratio greater than about 1, such as a cylinder or polygonal column, and the shape of the cross-section is not limited.

The light emitting element LD may have a size as small as a nanometer scale to a micrometer scale. As an example, the light emitting element LD may have a diameter D (or width) and/or a length L ranging from a nanometer scale to a micrometer scale. However, the size of the light emitting element LD is not limited thereto, and the size of the light emitting element LD may be variously changed according to design conditions of various devices using a light emitting device using the light emitting element LD as a light source, for example, a display device.

The first semiconductor layer 11 may be a semiconductor layer of a first conductivity type. For example, the first semiconductor layer 11 may include a p-type semiconductor layer.

The active layer 12 may be disposed between the first semiconductor layer 11 and the second semiconductor layer 13. The active layer 12 may include a single well structure, a multi-well structure, a single quantum well structure, a multi-quantum well (MQW) structure, a quantum dot structure, or a quantum wire structure, but the disclosure is not limited thereto. The active layer 12 may include GaN, InGaN, InAlGaN, AlGaN, AlN, or the like, and various other materials may be included in the active layer 12.

In case that a voltage equal to or greater than a threshold voltage is applied to both ends of the light emitting element LD, the light emitting element LD may emit light while electron-hole pairs are combined in the active layer 12.

The second semiconductor layer 13 may be disposed under the active layer 12, and may include a semiconductor layer of a different type from that of the first semiconductor layer 11. The second semiconductor layer 13 may include an n-type semiconductor layer.

The electrode layer 14 may be disposed on the first end EP1 and/or the second end EP2 of the light emitting element LD. FIG. 2 shows a case in which the electrode layer 14 is formed on the first semiconductor layer 11 as an example, but the disclosure is not necessarily limited thereto. For example, a separate electrode layer may be further disposed on the second semiconductor layer 13. The electrode layer 14 may include a transparent metal or a transparent metal oxide.

An insulating film INF may be provided on a surface of the light emitting element LD. The insulating film INF may be directly disposed on surfaces of the first semiconductor layer 11, the active layer 12, the second semiconductor layer 13, and/or the electrode layer 14. The insulating film INF may expose the first and second ends EP1 and EP2. According to an embodiment, the insulating film INF may expose side portions of the electrode layer 14 and/or the second semiconductor layer 13 adjacent to the first and second ends EP1 and EP2 of the light emitting element LD.

The insulating film INF may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxides ($TiO_x$). According to an embodiment, the insulating film INF may be omitted.

Figure 3:
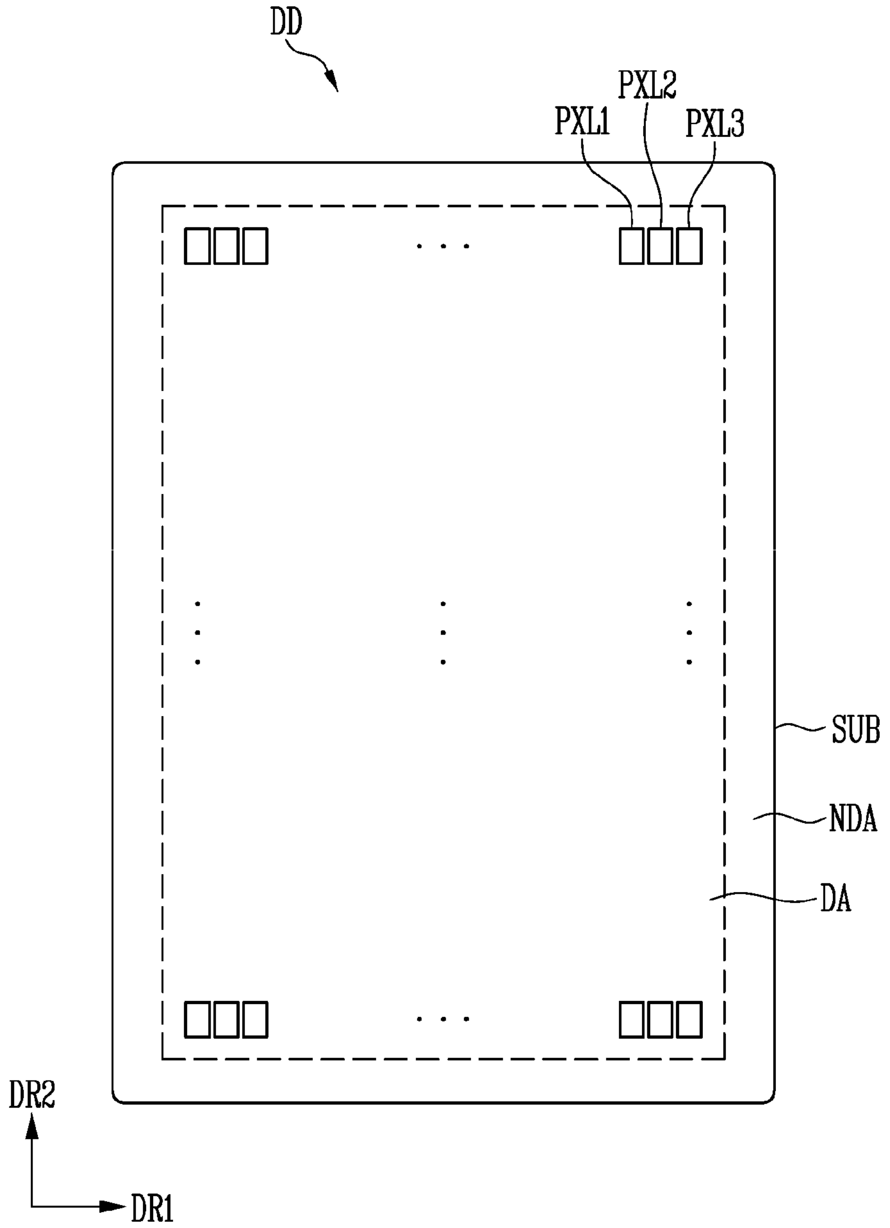
FIG. 3 is a schematic plan view illustrating a display device according to embodiments of the disclosure.

FIG. 3 is a schematic plan view illustrating a display device DD according to embodiments of the disclosure.

The disclosure may be applied if the display device DD is an electronic device having a display surface applied to at least one surface, such as a smartphone, a television, a tablet PC, a mobile phone, a video phone, an e-book reader, a desktop PC, a laptop PC, a netbook computer, a workstation, a server, a medical device, a camera, a wearable, or the like.

Referring to FIGS. 1, 2, and 3, the display device DD may include a substrate SUB, pixels PXL1, PXL2, and PXL3 provided on the substrate SUB and each including at least one light emitting element LD, a driver provided on the substrate SUB to drive the pixels PXL1, PXL2, and PXL3, and a wiring part electrically connecting the pixels PXL1, PXL2, and PXL3 to the driver.

The substrate SUB may include a display area DA and a non-display area NDA.

The display area DA may be an area in which the pixels PXL1, PXL2, and PXL3 displaying an image are provided. The non-display area NDA may be an area in which the driver for driving the pixels PXL1, PXL2, and PXL3 and a portion of the wiring part electrically connecting the pixels PXL1, PXL2, and PXL3 to the driver are provided.

The non-display area NDA may be located adjacent to the display area DA. The non-display area NDA may be provided on at least one side of the display area DA.

The wiring part may electrically connect the driver and the pixels PXL1, PXL2, and PXL3. The wiring part may include signal lines providing signals to the pixels PXL1, PXL2, and PXL3 and electrically connected to each of the pixels PXL1, PXL2, and PXL3, for example, a scan line and a data line, and fan-out lines connected to them.

The substrate SUB may include a transparent insulating material to transmit light. The substrate SUB may be a rigid substrate or a flexible substrate.

Each of the pixels PXL1, PXL2, and PXL3 may be provided in the display area DA on the substrate SUB.

The pixels PXL1, PXL2, and PXL3 may include a first pixel PXL1, a second pixel PXL2, and a third pixel PXL3. In an embodiment, the first pixel PXL1 may be a red pixel, the second pixel PXL2 may be a green pixel, and the third pixel PXL3 may be a blue pixel. However, the disclosure is not limited thereto, and each of the pixels PXL1, PXL2, and PXL3 may emit light of a color other than red, green, or blue.

Each of the pixels PXL1, PXL2, and PXL3 may include multiple light emitting elements LD driven by a corresponding scan signal and data signal. The light emitting element LD may have a size as small as a nano scale (or nanometer) to a micro scale (or micrometer). The light emitting elements disposed adjacent to each other may be connected in parallel, but the disclosure is not limited thereto. A light emitting element LD may constitute a light source of each of the pixels PXL1, PXL2, and PXL3.

Figure 4:
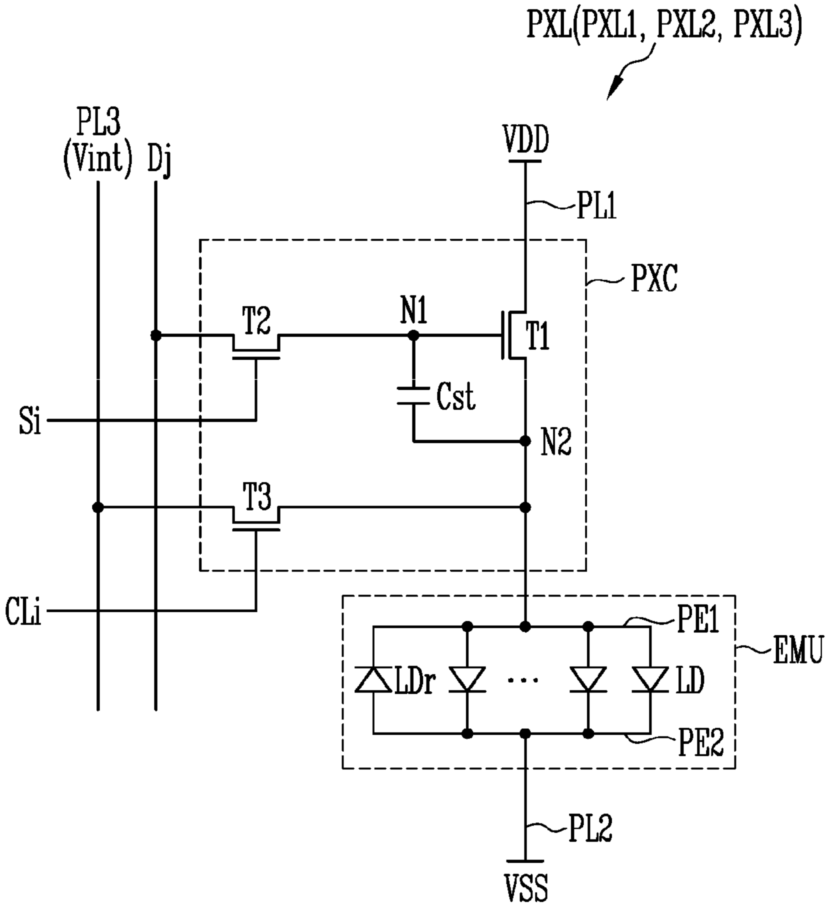
FIG. 4 is a schematic diagram illustrating an example of a pixel included in the display device of FIG. 3.

FIG. 4 is a schematic diagram illustrating an example of a pixel PXL included in the display device of FIG. 3.

In the following embodiments, the first pixel PXL1, the second pixel PXL2, and the third pixel PXL3 may be collectively referred to as a pixel PXL.

Referring to FIGS. 1, 2, 3, and 4, the pixel PXL may include a pixel circuit PXC and an emission component EMU.

In an embodiment, the emission component EMU may include light emitting elements LD connected in parallel between a first power source line PL1 and a second power source line PL2. Each of the light emitting elements LD may be connected to a first pixel electrode PE1 and a second pixel electrode PE2. Each of the light emitting elements LD connected in parallel in the same direction (for example, forward direction) between the first pixel electrode PE1 and the second pixel electrode PE2 may be an effective light source.

In an embodiment, the emission component EMU may further include at least one ineffective light source, for example, a reverse light emitting element LDr. The reverse light emitting element LDr may be electrically connected in a direction opposite to the light emitting elements LD between the first and second pixel electrodes PE1 and PE2. A current may not substantially flow through the reverse light emitting element LDr.

A voltage of a first power source VDD may be supplied to the first power source line PL1, and a voltage of a second power source VSS may be supplied to the second power source line PL2. The first power source VDD and the second power source VSS may have different potentials. For example, the first power source VDD may be set as a high potential power source, and the second power source VSS may be set as a low potential power source. A potential difference between the first and second power sources VDD and VSS may be set to be greater than or equal to a threshold voltage of the light emitting elements during an emission period of the pixel PXL.

The pixel circuit PXC may be electrically connected to a scan line Si and a data line Dj of the pixel PXL, where i and j may be positive integers. Also, the pixel circuit PXC may be further electrically connected to a third power source line PL3 and a control line CLi. For example, in case that the pixel PXL is disposed in an i-th row and a j-th column of the display area DA, the pixel circuit PXC of the pixel PXL may be electrically connected to an i-th scan line Si and a j-th data line Dj.

In an embodiment, the pixel circuit PXC may include first to third transistors T1 to T3 and a storage capacitor Cst.

The first transistor T1 may be a driving transistor for controlling a driving current applied to the emission component EMU. The first transistor T1 may be electrically connected between the first power source line PL1 and the emission component EMU (for example, the light emitting elements LD). A gate electrode of the first transistor T1 may be electrically connected to a first node N1.

The first transistor T1 may control the amount of the driving current applied from the first power source VDD to the emission component EMU through a second node N2 according to a voltage applied to the first node N1.

The second transistor T2 may be a switching transistor that selects the pixel PXL in response to a scan signal. The second transistor T2 may be electrically connected between the j-th data line Dj and the first node N1. A gate electrode of the second transistor T2 may be electrically connected to the i-th scan line Si.

The second transistor T2 may be turned on by the scan signal supplied to the i-th scan line Si, and may transmit a data signal to the gate electrode of the first transistor T1.

The third transistor T3 may be electrically connected between the third power source line PL3 and a second electrode of the first transistor T1 (for example, the second node N2). A gate electrode of the third transistor T3 may be electrically connected to an i-th control line CLi. In an embodiment, a control signal may be supplied to the i-th control line CLi at the same time as the scan signal supplied to the i-th scan line Si.

The third power source line PL3 may provide a voltage of a third power source Vint (for example, an initialization power source). For example, the third power source line PL3 may be commonly connected to multiple pixels PXL. The voltage of the third power source Vint may be different from the voltage of the first power source VDD and the voltage of the second power source VSS.

In case that the third transistor T3 is turned on, the voltage of the third power source Vint may be applied to the second node N2. In case that the data signal is supplied to the pixel PXL, the voltage of the third power source Vint may be supplied to the second node N2, so that a voltage corresponding to a difference between the data signal and the third power source Vint may be stored in the storage capacitor Cst. Accordingly, the pixel PXL can be stably driven.

The storage capacitor Cst may be electrically connected between the first node N1 and the second node N2. The storage capacitor Cst may be charged with a data voltage corresponding to the data signal supplied to the first node N1.

FIG. 4 shows an embodiment in which all of the first, second, and third transistors T1, T2, and T3 included in the pixel circuit PXC are N-type transistors, but the disclosure is not limited thereto. For example, at least one of the above-described first, second, and third transistors T1, T2, and T3 may be changed to a P-type transistor. Also, the structure of the pixel circuit PXC may be modified into various structures.

Figure 5:
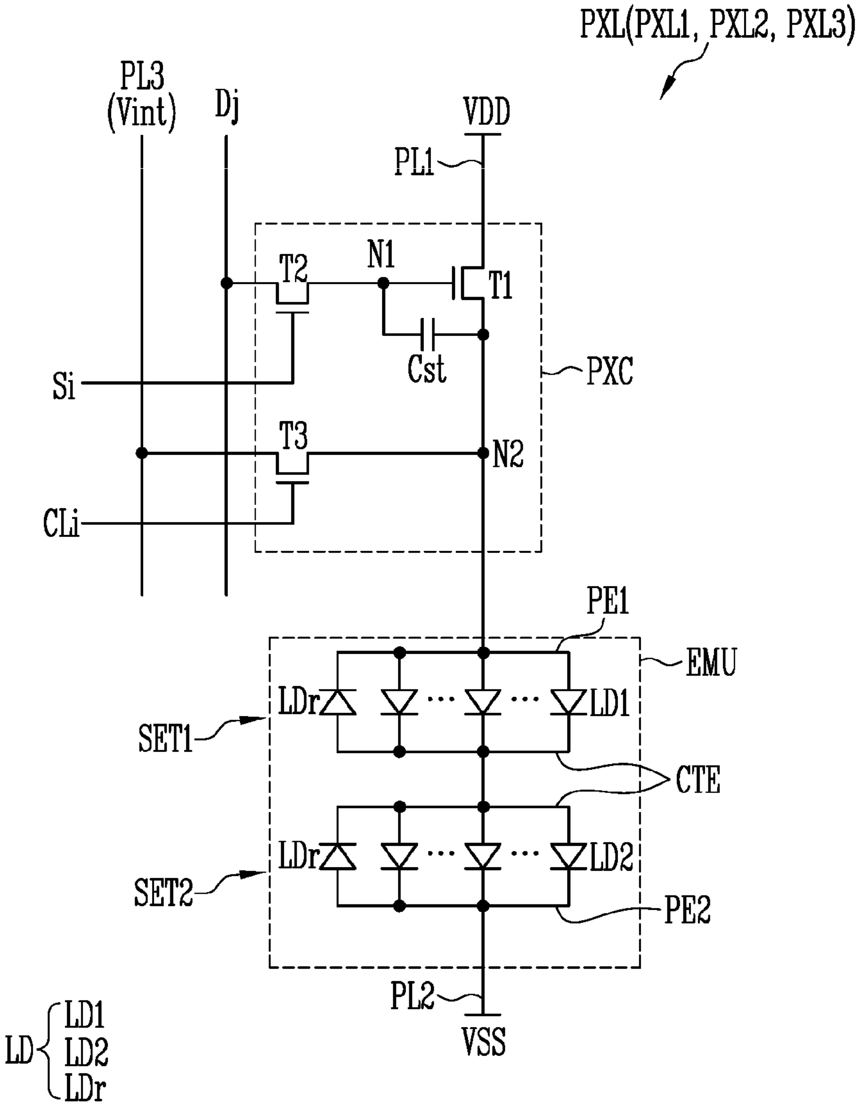
FIG. 5 is a schematic diagram illustrating an example of the pixel included in the display device of FIG. 3.

FIG. 5 is a schematic diagram illustrating an example of the pixel PXL included in the display device of FIG. 3.

In FIG. 5, the same reference numerals are used for the same or similar components described with reference to FIG. 4, and duplicate descriptions thereof will be omitted. The pixel PXL of FIG. 5 may have a structure substantially the same as or similar to that of the pixel PXL of FIG. 4 except for the configuration of the emission component EMU.

Referring to FIGS. 1, 2, 3, and 5, the pixel PXL may include a pixel circuit PXC and an emission component EMU.

In an embodiment, the emission component EMU may include emission stages SET1 and SET2 (or series stages) including multiple light emitting elements LD electrically connected in parallel to each other. For example, the emission component EMU may have a series/parallel mixed structure as shown in FIG. 5.

The emission component EMU may include first and second emission stages SET1 and SET2 electrically connected in series between the first and second power sources VDD and VSS. Each of the first and second emission stages SET1 and SET2 may include two electrodes PE1 and CTE or CTE and PE2 constituting an electrode pair of a corresponding stage, and multiple light emitting elements LD electrically connected therebetween.

The first emission stage SET1 (or a first serial stage) may include a first pixel electrode PE1, an intermediate electrode CTE, and multiple first light emitting elements LD1 electrically connected between the first pixel electrode PE1 and the intermediate electrode CTE. Also, the first emission stage SET1 may include a reverse light emitting element LDr electrically connected in an opposite direction to the first light emitting elements LD1 between the first pixel electrode PE1 and the intermediate electrode CTE.

The second emission stage SET2 (or a second serial stage) may include the intermediate electrode CTE, a second pixel electrode PE2, and multiple second light emitting elements LD2 electrically connected between the intermediate electrode CTE and the second pixel electrode PE2.

The intermediate electrode CTE may be included in common in the first emission stage SET1 and the second emission stage SET2. For example, the first emission stage SET1 and the second emission stage SET2 may share the intermediate electrode CTE. However, this is only an example, and the intermediate electrode CTE may be divided into a first intermediate electrode connected to the first emission stage SET1 and a second intermediate electrode connected to the second emission stage SET2. The first intermediate electrode and the second intermediate electrode may be electrically and/or physically connected to each other.

Also, the second emission stage SET2 may include a reverse light emitting element LDr electrically connected in an opposite direction to the second light emitting elements LD2 between the intermediate electrode CTE and the second pixel electrode PE2.

In an embodiment, the first pixel electrode PE1 may be an anode of the pixel PXL, and the second pixel electrode PE2 may be a cathode of the pixel PXL. However, this is only an example, and according to an embodiment, the first pixel electrode PE1 may be a cathode and the second pixel electrode PE2 may be an anode.

The emission component EMU having the series/parallel mixed structure of FIG. 5 may reduce the driving current compared to an emission component having a structure in which light emitting elements LD are connected only in parallel. The emission component EMU having the series/parallel mixed structure of FIG. 5 may reduce a driving voltage applied to both ends of the emission component EMU compared to an emission component having a structure in which the same number of light emitting elements LD are all connected in series, thereby improving light output efficiency of the light emitting elements LD.

Figure 6:
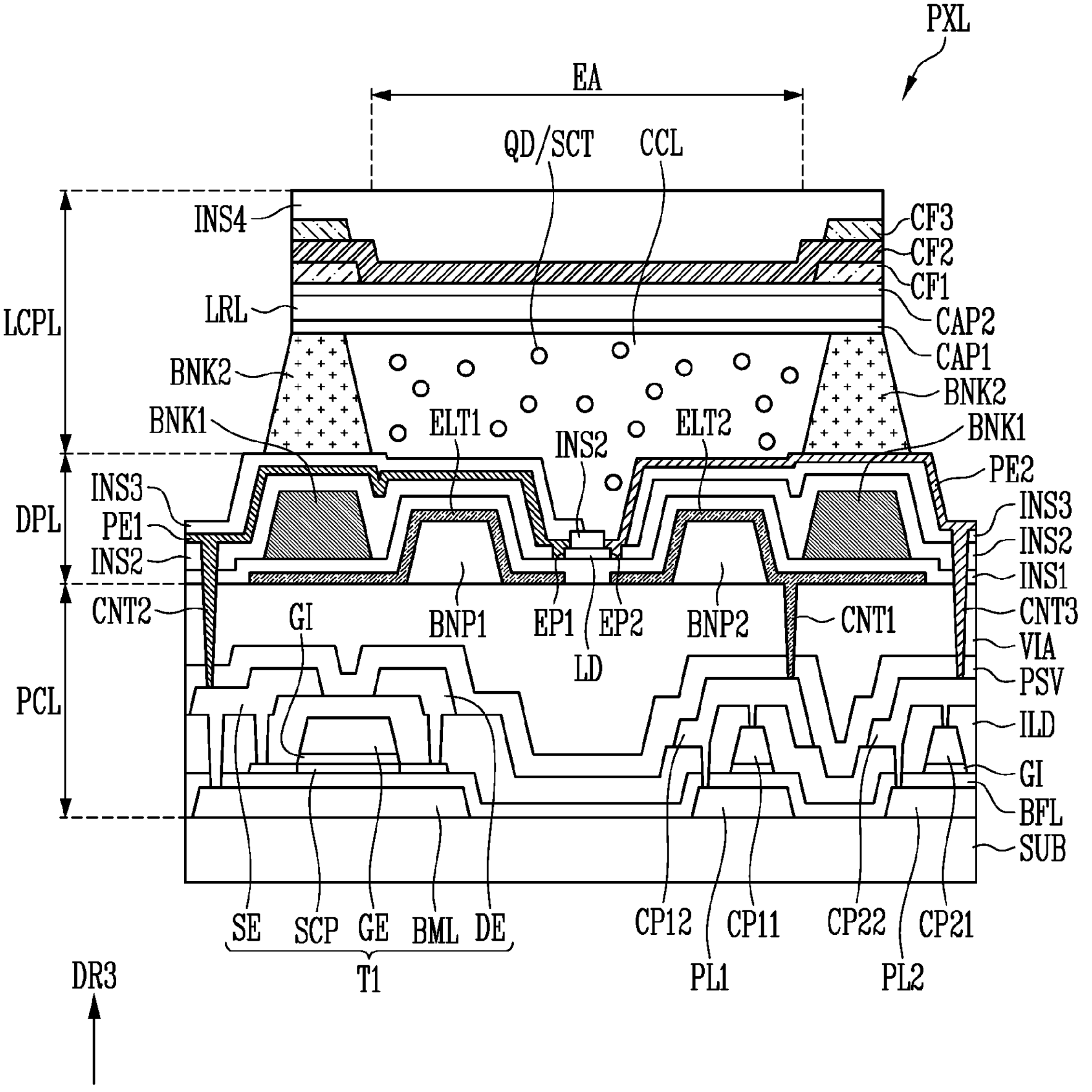
FIG. 6 is a schematic cross-sectional view illustrating an example of the pixel included in the display device of FIG. 3.

FIG. 6 is a schematic cross-sectional view illustrating an example of the pixel PXL included in the display device of FIG. 3.

Referring to FIGS. 3 and 6, the pixel PXL may include a pixel circuit layer PCL, a display element layer DPL, and a light conversion layer LCPL disposed on a substrate SUB.

The pixel circuit layer PCL may include the pixel circuit PXC described with reference to FIG. 4. For example, the pixel circuit layer PCL may include the first transistor T1, the first power source line PL1, the second power source line PL2, and insulating layers BFL, ILD, GI, ILD, PSV, and VIA. The first transistor T1 may include a lower metal layer BML, a semiconductor pattern SCP, a gate electrode GE, a source electrode SE, and a drain electrode DE.

The substrate SUB may constitute a base member of the display device DD. The substrate SUB may be a rigid or flexible substrate or film. The substrate SUB may include a transparent insulating material to transmit light.

A first conductive layer may be disposed on the substrate SUB. The first conductive layer may include at least one of various metal materials such as silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and/or an alloy thereof. The first conductive layer may be composed of a single layer, a double layer, or multiple layers.

The first conductive layer may include the lower metal layer BML, the first power source line PL1, and the second power source line PL2. The lower metal layer BML and the gate electrode GE of the first transistor T1 may overlap each other with a buffer layer BFL interposed therebetween. The lower metal layer BML may be disposed under the semiconductor pattern SCP of the first transistor T1. For example, the lower metal layer BML may serve as a light blocking pattern for stabilizing operating characteristics of the first transistor T1.

In an embodiment, the lower metal layer BML may be electrically connected to the source electrode SE of the first transistor T1 through a contact hole. Accordingly, a threshold voltage of the first transistor T1 may be shifted in a negative direction or a positive direction.

The buffer layer BFL may cover the first conductive layer and may be disposed on the substrate SUB. The buffer layer BFL may prevent impurities from diffusing into the pixel circuit layer PCL.

The buffer layer BFL may include an inorganic material. For example, the inorganic material may include at least one of silicon nitride $SiN_x$, silicon oxide $SiO_x$, silicon oxynitride $SiO_xN_y$, and a metal oxide such as aluminum oxide $AlO_x$.

The semiconductor pattern SCP may be disposed on the buffer layer BFL. The semiconductor pattern SCP may include a first region (for example, a source region) connected to the source electrode SE, a second region (for example, a drain region) connected to the drain electrode DE, and a channel region between the first and second regions. The channel region may overlap the gate electrode GE. The semiconductor pattern SCP may be a semiconductor pattern formed of polysilicon, amorphous silicon, an oxide semiconductor, and/or the like.

A gate insulating layer GI may be disposed on the semiconductor pattern SCP. The gate insulating layer GI may be disposed on only a portion of the semiconductor pattern SCP or disposed on the entire surface of the buffer layer BFL. The gate insulating layer GI may include an inorganic material. However, the disclosure is not limited thereto, and the gate insulating layer GI may include an organic material. For example, the organic material may include at least one of an acrylic resin, an epoxy resin, a phenolic resin, a polyamides resin, a polyimides resin, an unsaturated polyester resin, a polyphenylene ethers resin, a polyphenylene sulfides resin, and a benzocyclobutene resin.

A second conductive layer may be disposed on the gate insulating layer GI. The second conductive layer may include a conductive material similar to that of the first conductive layer. The second conductive layer may include the gate electrode GE, an eleventh connection pattern CP11, and a twenty-first connection pattern CP21.

The gate electrode GE may overlap the channel region of the semiconductor pattern SCP. The eleventh connection pattern CP11 may overlap the first power source line PL1, and the twenty-first connection pattern CP21 may overlap the second power source line PL2.

An interlayer insulating layer ILD may cover the second conductive layer and may be disposed on the entire surface of the buffer layer BFL. The interlayer insulating layer ILD may include an inorganic material. The interlayer insulating layer ILD may include an organic material.

A third conductive layer may be disposed on the interlayer insulating layer ILD. The third conductive layer may include a conductive material. The third conductive layer may include the source electrode SE, the drain electrode DE, a twelfth connection pattern CP12, and a twenty-second connection pattern CP22.

The source electrode SE may be electrically connected to the first region of the semiconductor pattern SCP through a contact hole. The source electrode SE may be electrically connected to the lower metal layer BML through a contact hole. The drain electrode DE may be electrically connected to the second region of the semiconductor pattern SCP through a contact hole.

The twelfth connection pattern CP12 may be electrically connected to the first power source line PL1 and the eleventh connection pattern CP11, and the twenty-second connection pattern CP22 may be electrically connected to the second power source line PL2 and the twenty-first connection pattern CP21.

The eleventh connection pattern CP11 and the twelfth connection pattern CP12 may be electrically connected to the first power source line PL1 to reduce resistance of the first power source line PL1. The twenty-first connection pattern CP21 and the twenty-second connection pattern CP22 may be electrically connected to the second power source line PL2 to reduce resistance of the second power source line PL2.

A passivation layer PSV may cover the third conductive layer and may be disposed on the entire surface of the interlayer insulating layer ILD. The passivation layer PSV may include an inorganic material. According to an embodiment, the passivation layer PSV may be omitted.

A via layer VIA (or passivation layer) may be disposed on the entire surface of the passivation layer PSV. The via layer VIA may include an organic material. The via layer VIA may provide a flat surface thereon.

The display element layer DPL may be disposed on the via layer VIA.

The display element layer DPL may include first and second bank patterns BNP1 and BNP2, first and second electrodes ELT1 and ELT2 (alignment electrodes or reflective electrodes), a first bank BNK1, the light emitting element LD, first and second pixel electrodes PE1 and PE2 (or contact electrodes), and insulating layers INS1, INS2, and INS3.

The first and second bank patterns BNP1 and BNP2 may be disposed on the via layer VIA.

Each of the first and second bank patterns BNP1 and BNP2 may have a cross-sectional shape in which a width becomes narrower from a surface (for example, an upper surface) of the via layer VIA toward an upper portion along the third direction DR3.

The first and second bank patterns BNP1 and BNP2 may include an inorganic material and/or an organic material, and may be composed of a single layer or multiple layers. According to an embodiment, the first and second bank patterns BNP1 and BNP2 may be omitted. For example, structures corresponding to the first and second bank patterns BNP1 and BNP2 may be formed in the via layer VIA.

The first and second electrodes ELT1 and ELT2 may be disposed on the via layer VIA and the first and second bank patterns BNP1 and BNP2. The first electrode ELT1 may be disposed on the first bank pattern BNP1, and the second electrode ELT2 may be disposed on the second bank pattern BNP2.

Each of the first and second electrodes ELT1 and ELT2 may include a conductive material having a predetermined or selected reflectance so that light emitted from the light emitting element LD travels in an image display direction (for example, the third direction DR3) of the display device DD. The first and second electrodes ELT1 and ELT2 may be composed of a single layer or multiple layers.

The second electrode ELT2 may be electrically connected to the twelfth connection pattern CP12 through a first contact hole CNT1 penetrating the via layer VIA and the passivation layer PSV. The second electrode ELT2 may be electrically connected to the first power source line PL1. The second electrode ELT2 may be directly connected to the twelfth connection pattern CP12, but the disclosure is not limited thereto. For example, the second electrode ELT2 may be electrically connected to the twelfth connection pattern CP12 (the eleventh connection pattern CP11 or the first power source line PL1) through a bridge electrode.

The first and second electrodes ELT1 and ELT2 may be used as alignment electrodes for aligning the light emitting element LD in a manufacturing process of the display device DD.

A first insulating layer INS1 may be disposed on the via layer VIA to cover at least a portion of the first and second electrodes ELT1 and ELT2. The first insulating layer INS1 may prevent a short circuit between the first electrode ELT1 and the second electrode ELT2. The first insulating layer INS1 may include an inorganic material.

The light emitting element LD may be disposed on the first insulating layer INS1. The first end EP1 of the light emitting element LD may face the first electrode ELT1 and the second end EP2 of the light emitting element LD may face the second electrode ELT2. For example, the light emitting element LD may be aligned between the first electrode ELT1 and the second electrode ELT2. For example, the light emitting element LD may be aligned between the first and second bank patterns BNP1 and BNP2.

In an embodiment, the first end EP1 of the light emitting element LD may be in contact with the first electrode ELT1, and the second end EP2 of the light emitting element LD may be in contact with the second electrode ELT2.

The first bank BNK1 may be disposed on the first insulating layer INS1. In the step of supplying the light emitting element LD on the first insulating layer INS1, the first bank BNK1 may be a dam structure that prevents a solution (ink or the like) including the light emitting element LD from flowing into adjacent pixels or controls a predetermined or selected amount of solution to be supplied to each pixel PXL. Also, the first bank BNK1 may define an emission area EA. For example, the emission area EA may correspond to an opening of the first bank BNK1.

The first bank BNK1 may include an organic material. According to an embodiment, the first bank BNK1 may include a light blocking material and/or a reflective material. The first bank BNK1 may prevent a light leakage defect in which light leaks between the pixels PXL. For example, the first bank BNK1 may include a color filter material or a black matrix material. As another example, a reflective material layer may be separately provided and/or formed on the first bank BNK1 to further improve the efficiency of light emitted from the pixel PXL to outside.

A second insulating layer INS2 may be disposed on the light emitting element LD. The second insulating layer INS2 may be disposed on a portion of the light emitting element LD so that the first end EP1 and the second end EP2 of the light emitting element LD are exposed to the outside. In an embodiment, the second insulating layer INS2 may also be disposed on the first insulating layer INS1 and the first bank BNK1.

The second insulating layer INS2 may include an inorganic material or an organic material. As the second insulating layer INS2 may be disposed on the light emitting element LD after the light emitting element LD is aligned on the first insulating layer INS1, it may be possible to prevent the light emitting element LD from being separated from the aligned position.

The first pixel electrode PE1 may overlap the first electrode ELT1 and may be disposed on the second insulating layer INS2. The first pixel electrode PE1 may be in direct contact with the first end EP1 of the light emitting element LD. In an embodiment, the first pixel electrode PE1 may be electrically connected to the source electrode SE of the transistor T1 through a second contact hole CNT2 penetrating the second insulating layer INS2, the first insulating layer INS1, the via layer VIA, and the passivation layer PSV. For example, the first pixel electrode PE1 may electrically connect the first end EP1 of the light emitting element LD and the source electrode SE of the first transistor T1.

In an embodiment, the first pixel electrode PE1 and the second pixel electrode PE2 may include indium tin oxide including indium oxide (for example, $InO_x$) and tin oxide (for example, $SnO_x$). Indium tin oxide may be transparent and may have conductivity.

A third insulating layer INS3 may cover the second insulating layer INS2 and the first pixel electrode PE1, and may be disposed on the second insulating layer INS2 and the first pixel electrode PE1. The second end EP2 of the light emitting element LD may be exposed from the second insulating layer INS2.

The third insulating layer INS3 may include an inorganic material or an organic material.

The second pixel electrode PE2 may be disposed on the second electrode ELT2. The second pixel electrode PE2 may be in direct contact with the second end EP2 of the light emitting element LD. The second pixel electrode PE2 may be in contact with or electrically connected to the twenty-second connection pattern CP22 through a third contact hole CNT3 penetrating the third insulating layer INS3, the second insulating layer INS2, the first insulating layer INS1, the via layer VIA, and the passivation layer PSV. For example, the second pixel electrode PE2 may electrically connect the second end EP2 of the light emitting element LD and the second power source line PL2.

In FIG. 6, an embodiment in which the first pixel electrode PE1 and the second pixel electrode PE2 are positioned on different layers with the third insulating layer INS3 interposed therebetween has been described as an example, but the disclosure is not limited thereto. For example, the first pixel electrode PE1 and the second pixel electrode PE2 may be disposed on the same layer (for example, the second insulating layer INS2) through the same process.

The first pixel electrode PE1 and the second pixel electrode PE2 may have composition ratios and/or physical properties different from those of general indium tin oxide referred to as "ITO". In an embodiment, each of the first pixel electrode PE1 and the second pixel electrode PE2 may be formed by heat-treating an indium-tin alloy deposited on the display element layer DPL in a vacuum atmosphere, heat-treating the indium-tin alloy in an oxygen atmosphere, and patterning the indium-tin alloy through an exposure process.

A composition ratio of indium tin oxide may be determined by adjusting a composition ratio of indium and tin in the indium-tin alloy. In an embodiment, indium tin oxide may have a mass percentage of the indium oxide of from about 85 wt % to about 95 wt % and the tin oxide from about 5 wt % to about 15 wt %.

In an embodiment, the thickness of the first pixel electrode PE1 and the second pixel electrode PE2 formed of indium tin oxide may be about 150 Å to about 500 Å. The resistivity of indium tin oxide may be about 270 μΩ-cm to about 350 μΩ-cm.

The light conversion layer LCPL may be disposed on the display element layer DPL. The light conversion layer LCPL may further include a second bank BNK2, a color conversion layer CCL, and color filters CF1, CF2, and CF3.

The second bank BNK2 may be disposed on the display element layer DPL. The second bank BNK2 may be located in a non-emission area surrounding the emission area EA and may be a structure defining a location to which the color conversion layer CCL is to be supplied. For example, the second bank BNK2 may define the emission area EA together with the first bank BNK1.

The second bank BNK2 may include an organic material. According to an embodiment, the second bank BNK2 may include a light blocking material. For example, the second bank BNK2 may be a black matrix. According to an embodiment, the second bank BNK2 may be configured to include at least one light blocking material and/or reflective material so that light emitted from the color conversion layer CCL further travels in the image display direction (or the third directions DR3) of the display device DD, thereby improving light output efficiency of the color conversion layer CCL.

The color conversion layer CCL may be disposed on the display element layer DPL (or the light emitting element LD) in a region surrounded by the second bank BNK2.

The color conversion layer CCL may include color conversion particles QD (or wavelength conversion particles) corresponding to a specific color. For example, the color conversion layer CCL may include color conversion particles QD that convert light of a first color (or a first wavelength band) incident from the light emitting element LD into light of a second color (or a specific color, a second wavelength band) and emit the light.

For example, the color conversion layer CCL may include color conversion particles QD formed of quantum dots that convert light of a first color emitted from the light emitting element LD into light of a second color (for example, red, green, or blue).

According to an embodiment, in case that the light emitting element LD emits light of a first color (for example, blue series) and the pixel PXL is a pixel of the first color (for example, blue), the color conversion layer CCL may include a light scattering layer including light scattering particles SCT. The light scattering layer may be omitted in some embodiments. In an embodiment, a transparent polymer may be provided instead of the light scattering layer.

A first capping layer CAP1 may be disposed on the color conversion layer CCL and the second bank BNK2. The first capping layer CAP1 may have a flat surface while reducing a step difference caused by the components disposed thereunder. The first capping layer CAP1 may prevent moisture (or a solution used in a subsequent process) from penetrating into the color conversion layer CCL. The first capping layer CAP1 may include an inorganic material.

A low refractive index layer LRL may be disposed on the first capping layer CAP1. The low refractive index layer LRL may be disposed on the entire surface of the first capping layer CAP1. The low refractive index layer LRL may include an inorganic material or an organic material.

According to an embodiment, the low refractive index layer LRL may improve light output efficiency of the pixel PXL by totally reflecting light (for example, light traveling in an oblique direction) emitted from the color conversion layer CCL by using a difference in refractive index with an adjacent component. To this end, the low refractive index layer LRL may have a relatively low refractive index compared to the color conversion layer CCL.

A second capping layer CAP2 may be disposed on the low refractive index layer LRL and may include an inorganic material. The second capping layer CAP2 may prevent moisture from penetrating into the low refractive index layer LRL.

A first color filter CF1, a second color filter CF2, and a third color filter CF3 may be disposed on the second capping layer CAP2. Each of the first, second, and third color filters CF1, CF2, and CF3 may have the color of a corresponding pixel PXL.

For example, the first color filter CF1 may be disposed in the emission area EA of the first pixel PXL1, the second color filter CF2 may be disposed in the emission area EA of the second pixel PXL2, and the third color filter CF3 may be disposed in the emission area EA of the third pixel PXL3. Each of the first, second, and third color filters CF1, CF2, and CF3 may include a color filter material that selectively transmits light of a specific color converted by the color conversion layer CCL. For example, the first color filter CF1 may be a red color filter, the second color filter CF2 may be a green color filter, and the third color filter CF3 may be a blue color filter.

The first, second, and third color filters CF1, CF2, and CF3 may be disposed to overlap each other in the non-emission area to block optical interference between adjacent sub-pixels. According to an embodiment, a separate light blocking pattern may be disposed in the non-emission area instead of the stacked structure of the first, second, and third color filters CF1, CF2, and CF3.

A fourth insulating layer INS4 may be disposed on the first, second, and third color filters CF1, CF2, and CF3. The fourth insulating layer INS4 may include an inorganic material or an organic material. The fourth insulating layer INS4 may completely cover the components disposed thereunder, and may block moisture or the like from flowing into the components from the outside.

In an embodiment, the fourth insulating layer INS4 may be formed of multiple layers. For example, the fourth insulating layer INS4 may include at least two inorganic layers and at least one organic layer interposed between the inorganic layers. However, the material and/or structure of the fourth insulating layer INS4 may be variously changed. In an embodiment, at least one overcoat layer, a filler layer, and/or an upper substrate may be further disposed on the fourth insulating layer INS4.

FIGS. 7 to 17 are schematic cross-sectional views illustrating a method of manufacturing a display device according to embodiments of the disclosure.

Referring to FIGS. 6 to 17, a method of manufacturing a display device may include aligning light emitting elements LD in an emission area EA on a substrate SUB, depositing an indium-tin alloy AL1 on the entire surface of the substrate SUB at room temperature, heat-treating the deposited indium-tin alloy AL1 or AL2 to reflow along the side surfaces of each of the light emitting elements LD, heat-treating the indium-tin alloy AL1 or AL2 in an oxygen atmosphere to form indium tin oxide AOL1 or AOL2, and etching the indium-tin oxide AOL1 or AOL2 to form a first pixel electrode PE1 or a second pixel electrode PE2 contacting first ends EP1 or second ends EP2 of at least a portion of the light emitting elements LD. Room temperature may be in range from about 18° C. to about 24° C. In an embodiment, room temperature may be in a range of from about 20° C. to about 22° C.

Figure 7:
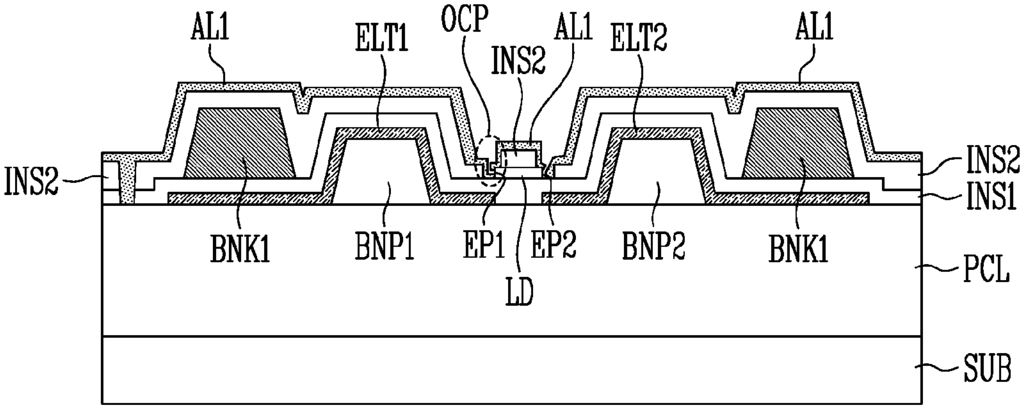
FIGS. 7 to 17 are schematic cross-sectional views illustrating a method of manufacturing a display device according to embodiments of the disclosure.

As shown in FIG. 7, the above-described pixel circuit layer PCL, first and second bank patterns BNP1 and BNP2, first and second electrodes ETL1 and ETL2, first insulating layer INS1, and first bank BNK1 may be sequentially formed through processes of depositing and patterning (for example, etching by exposure) insulating layers and conductive layers. The light emitting elements LD may be aligned between the first bank pattern BNP1 and the second bank pattern BNP2 through a process of aligning the light emitting elements LD. Thereafter, the second insulating layer INS2 may be formed.

The indium-tin alloy AL1 may be deposited on the entire surface of the second insulating layer INS2. In an embodiment, the indium-tin alloy AL1 thin film may be formed on the second insulating layer INS2 through a sputtering process in a room temperature atmosphere.

In an embodiment, a composition ratio of indium and tin in the indium-tin alloy AL1 may be adjusted according to a pixel structure, a driving purpose, and the like. By adjusting the composition ratio of indium and tin, the resistivity and/or light transmittance of the indium-tin oxide constituting the first and second pixel electrodes PE1 and PE2 may be adjusted.

Disconnection of the indium-tin alloy AL1 may be generated at a disconnection portion OCP due to a step difference between the light emitting element LD and the first insulating layer INS1. The disconnection portion OCP may include at least a portion of the ends EP1 and EP2 of the light emitting element LD. For example, due to the thin thickness of the indium-tin alloy AL1, the indium-tin alloy AL1 may be disconnected at the ends EP1 and EP2 of the light emitting element LD. The disconnection of the indium-tin alloy may cause a defective driving of the pixel PXL.

Figure 8:
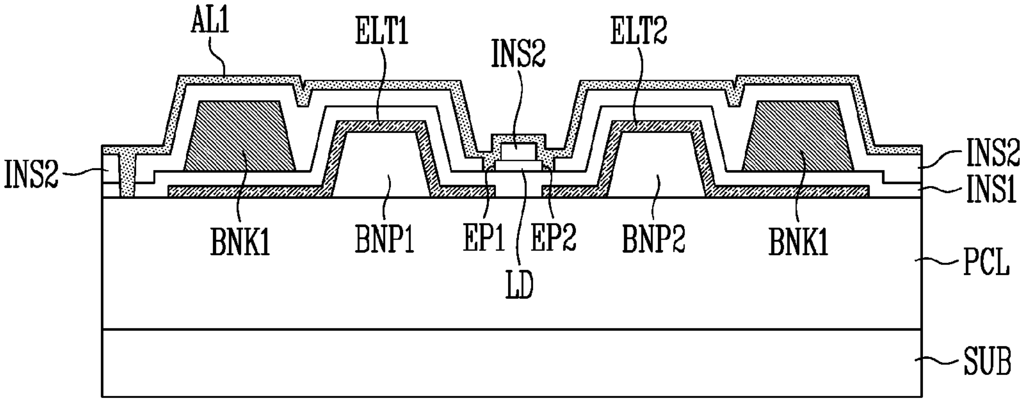

As shown in FIG. 8, by heat-treating the deposited indium-tin alloy AL1, the indium-tin alloy AL1 may be reflowed along the side surfaces of the light emitting element LD. The indium-tin alloy AL1 may have a low melting point of about 117° C.

In an embodiment, the indium-tin alloy AL1 may be heat-treated in a vacuum atmosphere of a relatively low temperature range of about 200° C. to about 230° C. for about 0.5 hour to about 1 hour. Accordingly, the indium-tin alloy AL1 may be reflowed, and portions in which the indium-tin alloy AL1 is disconnected in the disconnected portion OCP may be filled. For example, the disconnection of the indium-tin alloy AL1 thin film may be removed.

Figure 9:
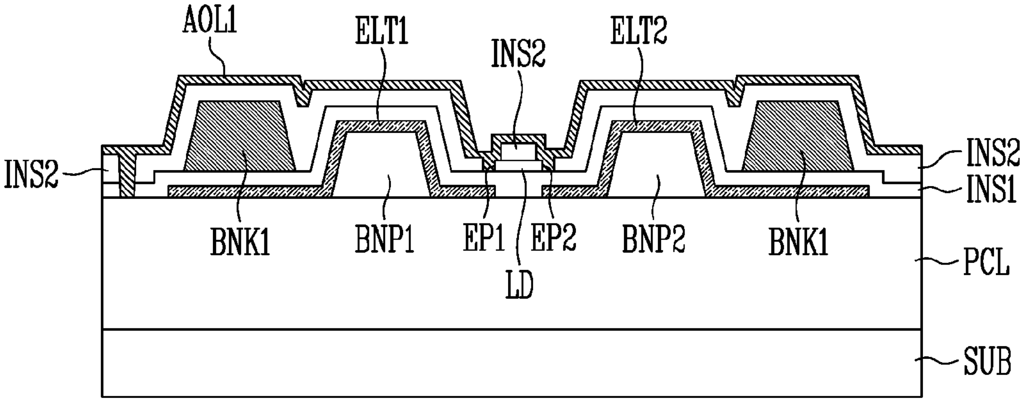

As shown in FIG. 9, the indium tin oxide AOL1 may be formed by heat-treating the indium-tin alloy AL1 thin film in the oxygen atmosphere. In an embodiment, the indium tin oxide AOL1 thin film may be formed by heat-treating the indium-tin alloy AL1 in the oxygen atmosphere of about 250° C. or less.

Based on a compositional ratio of indium and tin in the indium-tin alloy AL1, the indium tin oxide AOL1 may have a mass percentage of about 85 wt % to about 95 wt % of indium oxide and about 5 wt % to about 15 wt % of tin oxide. In this way, a composition ratio of indium oxide and tin oxide can be freely controlled within a predetermined or selected range depending on the purpose.

Figure 10:
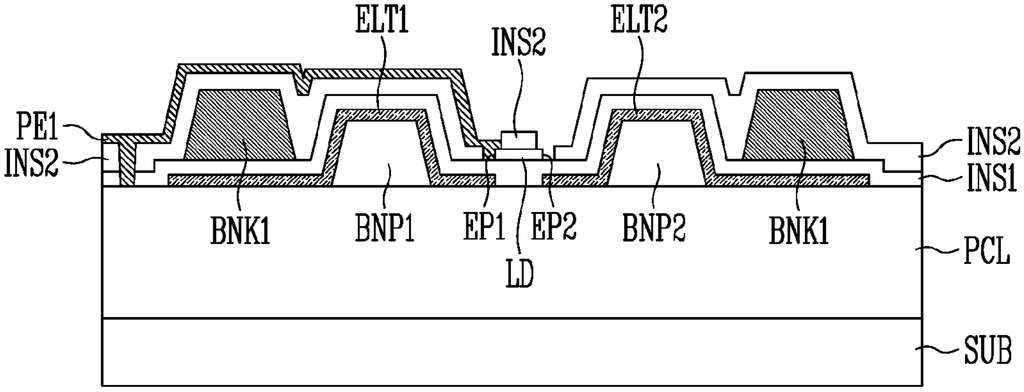

In an embodiment, as shown in FIG. 10, the first pixel electrode PE1 may be formed by etching the indium tin oxide AOL1 through an exposure process using a mask. The first pixel electrode PE1 may be in contact with the first end EP1 of the light emitting element LD.

The thickness of the first pixel electrode PE1 formed through the processes described with reference to FIGS. 7 to 10 may be about 150 Å to about 500 Å. In an embodiment, the resistivity of the indium tin oxide AOL1 included in the first pixel electrode PE1 may be about 270 μΩ-cm to about 350 μΩ-cm. The resistivity within the above-described range may be a level at which an electrical signal can be transmitted without distortion to a component in contact with the first pixel electrode PE1 through the first pixel electrode PE1. For example, a driving current may be stably supplied to the light emitting element LD without excessive voltage drop through the indium tin oxide AOL1 having the resistivity of about 270 μΩ-cm to about 350 μΩ-cm.

According to a comparative method of manufacturing a pixel electrode, the first pixel electrode PE1 may be formed by depositing ITO on the insulating layer (for example, the first insulating layer INS1) and patterning the ITO. Accordingly, the ITO may have a thickness of at least 8 μm, and the first and second pixel electrodes PE1 and PE2 may be formed thicker than this in order to prevent the disconnection of the ITO at the disconnection portion OCP.

The first pixel electrode PE1 formed according to the embodiments of the disclosure may have resistivity characteristics of a level capable of electrically driving the pixel PXL without any problem, and may have a thickness thinner than that of the comparative ITO electrode. The first pixel electrode PE1 having transparency may have a light transmittance equivalent to that of the comparative ITO electrode.

Figure 11:
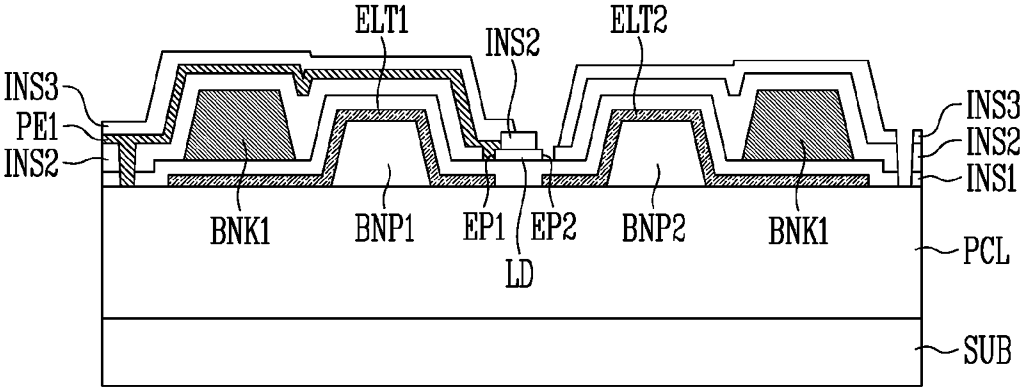

Thereafter, as shown in FIG. 11, the third insulating layer INS3 may be formed on the first pixel electrode PE1 and the second insulating layer INS2 to cover the first pixel electrode PE1. The third insulating layer INS3 may be etched to expose the second end EP2 of the light emitting element LD. A process of etching the insulating layer to form the third contact hole CNT3 (refer to FIG. 6) may be performed.

Figure 12:
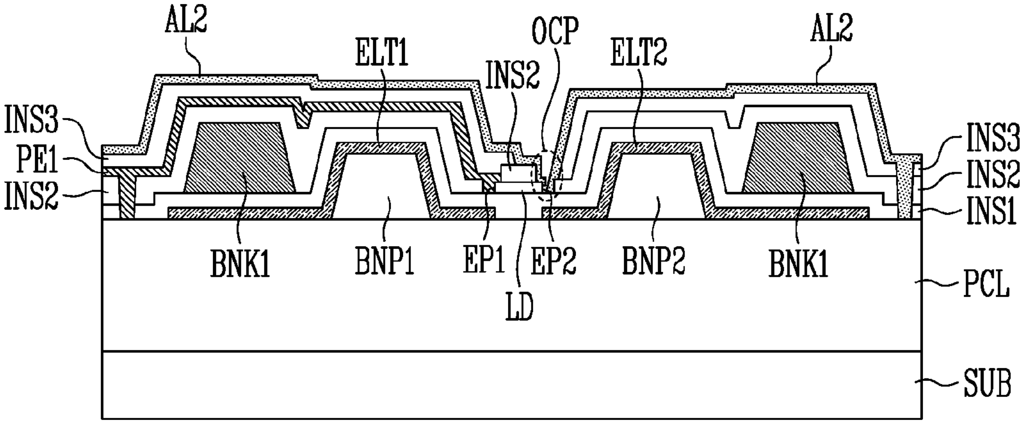

Thereafter, as shown in FIG. 12, the indium-tin alloy AL2 may be deposited on the entire surface of the third insulating layer INS3. In an embodiment, the indium-tin alloy AL2 thin film may be formed on the third insulating layer INS3 through a sputtering process in a room temperature atmosphere. A disconnection of the indium-tin alloy AL2 may occur at the disconnection portion OCP between the second end EP2 of the light emitting element LD and the third insulating layer INS3.

Figure 13:
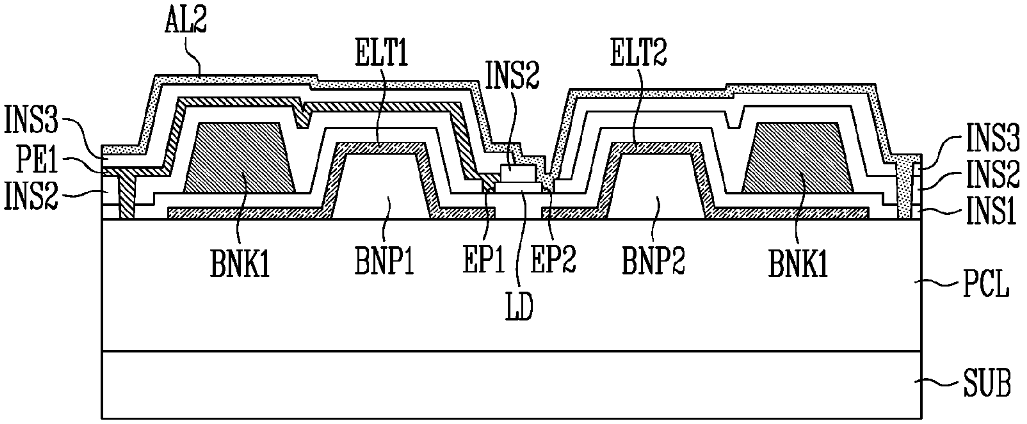

Thereafter, as shown in FIG. 13, by heat-treating the deposited indium-tin alloy AL2, the indium-tin alloy AL2 may be reflowed along the side surfaces of the light emitting element LD. In an embodiment, the indium-tin alloy AL2 may be heat-treated in a vacuum atmosphere of a temperature range of about 200° C. to about 230° C. for about 0.5 hour to about 1 hour. Accordingly, the disconnection of the indium-tin alloy AL2 thin film may be removed.

Figure 14:
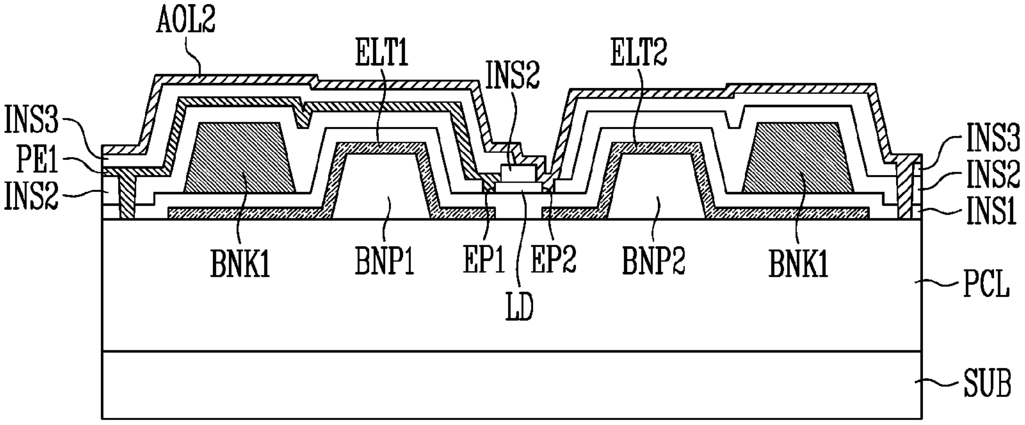

Thereafter, as shown in FIG. 14, the indium tin oxide AOL2 may be formed by heat-treating the indium-tin alloy AL2 thin film in the oxygen atmosphere. In an embodiment, the indium tin oxide AOL2 thin film may be formed by heat-treating the indium-tin alloy AL2 in the oxygen atmosphere of about 250° C. or less.

Figure 15:
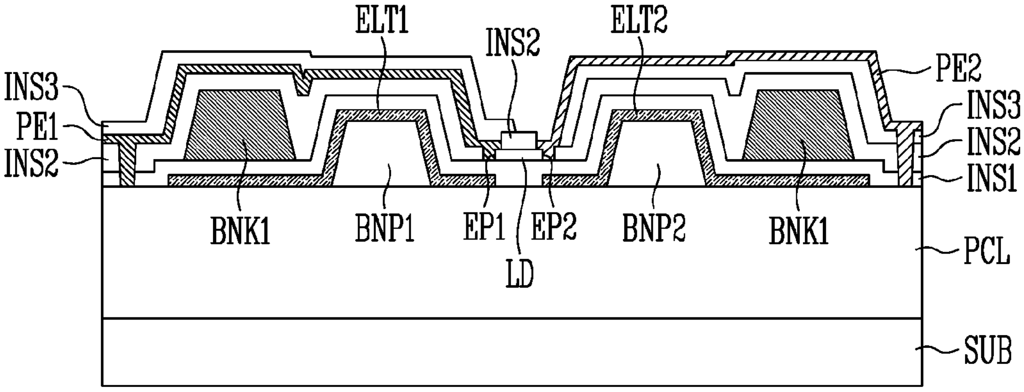

Thereafter, as shown in FIG. 15, the second pixel electrode PE2 may be formed by etching the indium tin oxide AOL2 through an exposure process using a mask. The second pixel electrode PE2 may be in contact with the second end EP2 of the light emitting element LD.

The thickness of the second pixel electrode PE2 may be about 150 Å to about 500 Å. In an embodiment, the resistivity of the indium tin oxide AOL2 included in the second pixel electrode PE2 may be about 270 μΩ-cm to about 350 μΩ-cm.

Figure 16:
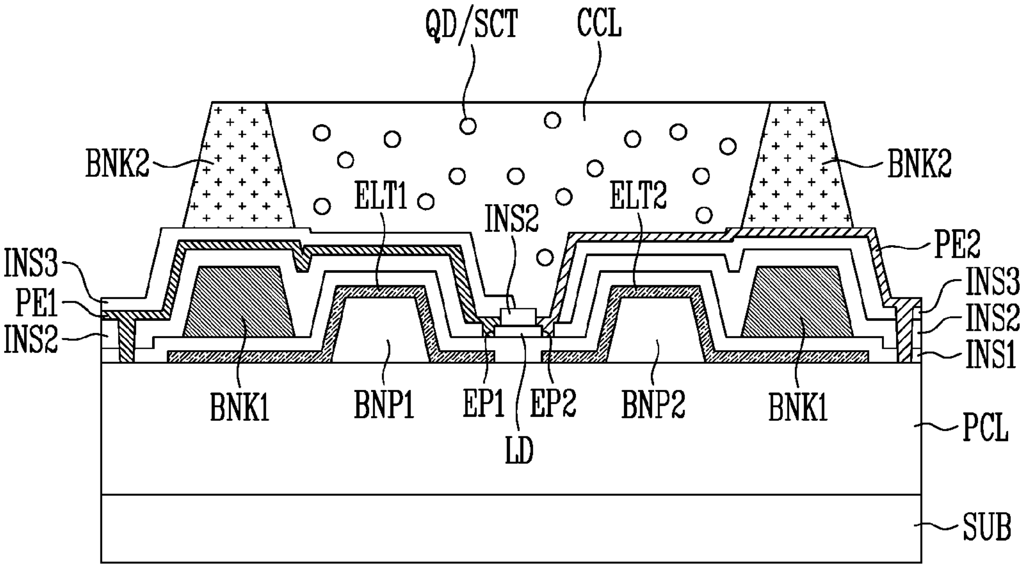

Thereafter, as shown in FIG. 16, the second bank BNK2 may be formed through an exposure process using a mask, and the color conversion layer CCL including color conversion particles QD or light scattering particles SCT may be filled (formed) in the opening (for example, the emission area EA of FIG. 6) of the second bank BNK2 through an inkjet process.

Figure 17:
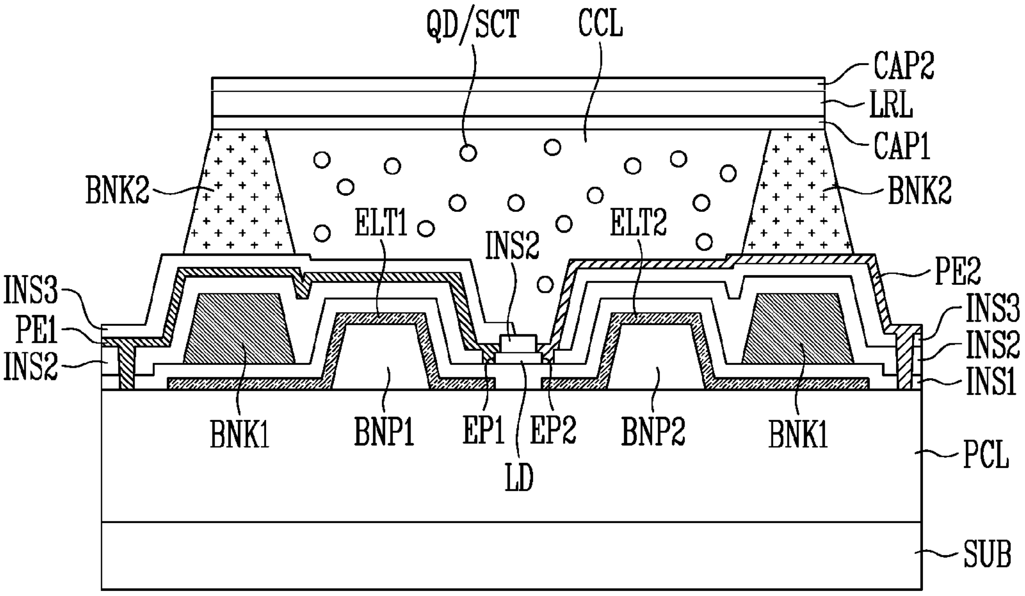

Thereafter, as shown in FIG. 17, the first capping layer CAP1, the low refractive index layer LRL, and the second capping layer CAP2 may be sequentially formed on the color conversion layer CCL and the second bank BNK2.

The first, second, and third color filters CF1, CF2, and CF3 may be sequentially formed, and the pixel PXL may be formed as shown in FIG. 6.

As described above, according to a display device and a method of manufacturing the same according to the embodiments of the disclosure, the transparent pixel electrode PE1 or PE2 having a light transmittance equivalent to that of general ITO and excellent resistivity characteristics, and having a very thin thickness of about 5 μm or less can be stably formed without disconnection at the side of the light emitting element LD. Accordingly, the defective driving of the pixel PXL may be reduced or minimized. As the pixel electrode PE1 or PE2 becomes thinner, visibility and image quality can be improved, and manufacturing cost can be reduced.

However, effects of the disclosure are not limited to the above-described effects, and may be variously extended without departing from the scope of the disclosure.

As set forth above, embodiments of the disclosure have been described with reference to the drawings. However, those skilled in the art will appreciate that various modifications and changes can be made to the disclosure without departing from the scope of the disclosure.

What is claimed is:

1. A method of manufacturing a display device, comprising:

aligning light emitting elements in an emission area on a substrate;

depositing an indium-tin alloy on an entire surface of the substrate at room temperature;

heat-treating the indium-tin alloy to reflow along side surfaces of each of the light emitting elements;

heat-treating the indium-tin alloy in an oxygen atmosphere to form indium tin oxide; and etching the indium tin oxide to form a first pixel electrode contacting first ends of at least a portion of the light emitting elements.

2. The method of claim 1, wherein in the heat-treating of the indium-tin alloy to reflow, the indium-tin alloy is heat-treated for about 0.5 hour to about 1 hour in a vacuum atmosphere at a temperature of about 200° C. to about 230° C.

3. The method of claim 1, wherein in the heat-treating of the indium-tin alloy in the oxygen atmosphere to form the indium tin oxide, the indium-tin alloy is heat-treated in the oxygen atmosphere of about 250° C. or less.

4. The method of claim 1, wherein a thickness of the first pixel electrode is about 150 Å to about 500 Å.

5. The method of claim 1, wherein the indium tin oxide includes indium oxide and tin oxide, and a composition ratio of the indium oxide and the tin oxide is determined by adjusting a composition ratio of indium and tin in the indium-tin alloy.

6. The method of claim 5, wherein the indium tin oxide has a mass percentage of about 85 wt % to about 95 wt % of the indium oxide and about 5 wt % to about 15 wt % of the tin oxide.

7. The method of claim 5, wherein a resistivity of the indium tin oxide is about 270 μΩ-cm to about 350 μΩ-cm.

8. The method of claim 5, wherein the light emitting elements have a diameter and a length of nanoscale.

9. The method of claim 1, further comprising:

patterning an insulating layer on the first pixel electrode;

depositing an indium-tin alloy on an entire surface of the insulating layer at room temperature;

heat-treating the indium-tin alloy to reflow along exposed side surfaces of each of the light emitting elements;

heat-treating the indium-tin alloy in an oxygen atmosphere to form indium tin oxide; and etching the indium tin oxide to form a second pixel electrode contacting second ends opposite the first ends of at least a portion of the light emitting elements.

10. The method of claim 9, wherein a thickness of the second pixel electrode is about 150 Å to about 500 Å.

11. The method of claim 9, wherein a resistivity of the indium tin oxide is about 270 μΩ-cm to about 350 μΩ-cm.

12. The method of claim 1, further comprising:

forming a color conversion layer including color conversion particles or light scattering particles and filling the emission area on the first pixel electrode; and forming a capping layer including an inorganic insulating material and a low refractive index layer having a lower refractive index than that of the color conversion layer on the color conversion layer.

13. The method of claim 1, wherein the light emitting elements are aligned in a direction between bank patterns formed adjacent to each other in the emission area.

* * * * *